United States Patent [19]

Tsukada

[11] Patent Number: 5,130,773
[45] Date of Patent: Jul. 14, 1992

[54] SEMICONDUCTOR DEVICE WITH PHOTOSENSITIVITY

[75] Inventor: Toshihisa Tsukada, Musashino, Japan

[73] Assignee: Hitachi, Ltd., Tokyo, Japan

[21] Appl. No.: 543,443

[22] Filed: Jun. 26, 1990

[30] Foreign Application Priority Data

Jun. 30, 1989 [JP] Japan .................. 1-166649

[51] Int. Cl.⁵ .................. H01L 27/01; H01L 45/00; H01L 27/14
[52] U.S. Cl. ...................... 357/23.7; 357/2; 357/4; 357/23.14; 357/30
[58] Field of Search ............... 357/23.7, 4, 30 I, 30 K, 357/2, 23.14

[56] References Cited

U.S. PATENT DOCUMENTS

| | | | |
|---|---|---|---|
| 4,077,044 | 2/1978 | Hayashi | 357/30 I |
| 4,598,305 | 7/1986 | Chang et al. | 357/30 I |
| 4,740,823 | 4/1988 | Thompson | 357/30 I |
| 4,845,355 | 7/1989 | Nakagawa et al. | 357/30 I |
| 4,951,113 | 8/1990 | Huang et al. | 357/23.7 |
| 4,956,680 | 9/1990 | Tanaka et al. | 357/23.7 |

FOREIGN PATENT DOCUMENTS 0279638 8/1988 European Pat. Off. ........... 357/23.7

Primary Examiner—Andrew J. James
Assistant Examiner—Ngan Van Ngo
Attorney, Agent, or Firm—Antonelli, Terry, Stout & Kraus

[57] ABSTRACT

A photosensor with improved performance is provided with a gate electrode structure for a field effect transistor that includes a semiconductor layer photosensitivity. The gate electrode can be constituted with a kind of metal or a low resistance semiconductor in conjunction with a semiconductor area with photosensitivity adjacent thereto. As a photosensitive semiconductor, amorphous silicon can be used because of its comparatively easy manufacturing method and its high sensitivity. As a field effect transistor, a thin film transistor of amorphous silicon can be used to correspond to the demand for making transistors over a large area. A MOSFET is preferably used as a field effect transistor for the improvement of sensitivity and speed of the sensor.

31 Claims, 6 Drawing Sheets

SEMICONDUCTOR DEVICE WITH PHOTOSENSITIVITY

BACKGROUND OF THE INVENTION

The present invention relates to a device structure which makes it possible to improve the performance of a photosensor.

The basic structure of a conventional phototransistor is a bipolar transistor, and it has a structure in which the base of a bipolar transistor is illuminated by the rays of light and the injection of a minority carrier into a base is performed by the rays of light.

SUMMARY OF THE INVENTION

An invention for solving problems in the prior art is described in a U.S. Ser. application No. 414322 in Sept. 1989 invented by the inventor of the present invention and others. In that case, a description is given concerning a phototransistor having an offset region between a source electrode and a drain electrode, wherein the rays of light are led into this offset region. The manufacturing process is similar to that for a thin film transistor, and it is a very effective device in which one transistor has photosensitivity, switching properties and amplifying properties. However, in the case of the above-mentioned phototransistor, the ON/OFF ratio of a drain current is in the order of $10^3$ at present, so that, in the case of integration of the phototransistor, it is necessary to realize a higher ON/OFF ratio.

In the present invention, a new structure is introduced to a gate electrode portion of a field effect transistor. In particular, in accordance with one aspect of the invention, the gate electrode, or at least part of it, is composed of a transistor with photosensitivity.

Further, in accordance with another aspect of the invention, the gate electrode is composed of a metal or a low resistance semiconductor, and, adjacent to it, a semiconductor area is provided which is made to be photosensitive.

Amorphous silicon, which is comparatively easy to manufacture and which has high sensitivity, is preferably used for a photosensitive semiconductor, and an amorphous silicon thin film transistor is used as a field effect transistor to correspond to the need for a large area one. A MOSFET is used as a field effect transistor for the improvement of sensitivity and speed.

The resistance of a gate electrode or of a photosensitive semiconductor area is varied by the incident light upon it. The resistance variation can be changed to a voltage variation, so that the gate voltage of a field effect transistor can be modulated.

The variation in the quantity of the incident light is converted to the variation in the resistance of a photosensitive semiconductor area, and further the resistance variation modulates a drain current through the variation in the gate voltage. As a result, a minute variation in the light can be used to produce an output signal having a large current (voltage) variation.

An ON/OFF current of a transistor is controlled by a gate voltage and so a large ON/OFF ratio can be realized by properly selecting a variation range of a resistance.

An object of the present invention is to solve the problems in the prior art.

Another object of the present invention is to provide a semiconductor device, and a manufacturing method therefore, in which a remarkable increase in the ON/OFF ratio of a drain current is possible.

A further object of the present invention is to provide a semiconductor device, and a manufacturing method therefor, which is excellent in photosensitive properties.

Yet another object of the present invention is to provide a semiconductor device, and a manufacturing method therefor, which is excellent in switching properties.

A still further object of the present invention is to provide a semiconductor device and a manufacturing method therefor which is excellent in amplifying properties.

An additional object of the present invention is to provide a semiconductor device, and a manufacturing method therefor, which is excellent in responding properties.

Another object of the present invention is to provide a photosensor which is excellent in the properties as a photosensor, that is to say, excellent in photosensitivity, switching properties, amplifying properties and responding properties, and whose manufacturing method is also comparatively easy.

These and other objects and many of the attendant advantages of this invention will be readily appreciated as the same becomes better understood with reference to the following detailed description when considered in connection with the accompanying

DETAILED DESCRIPTION OF THE INVENTION

Figure 1:
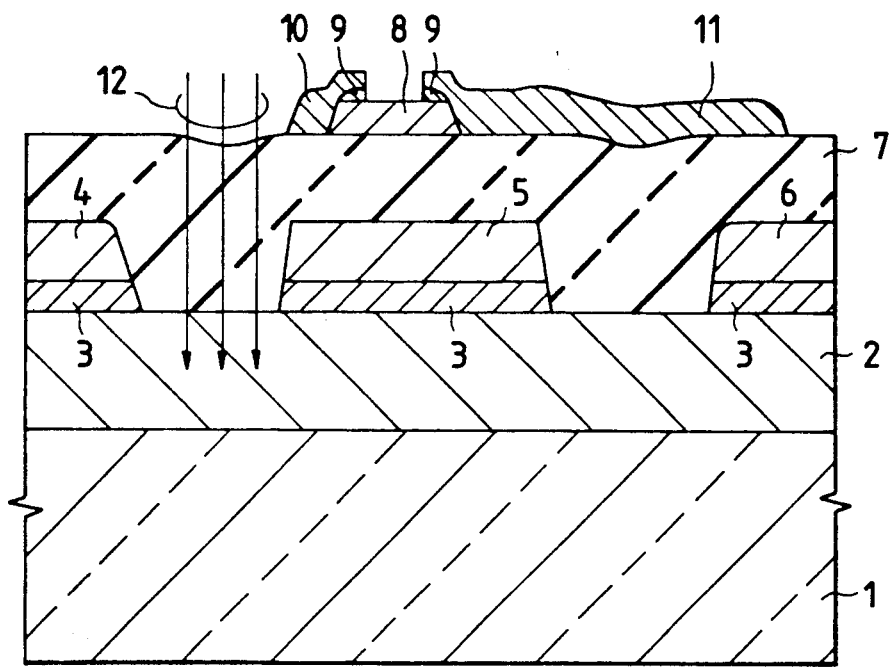
FIG. 1 is a cross-sectional view of a photosensor in a first embodiment of a TFT (thin-film-transistor) system according to the present invention.

An embodiment according to the present invention will be explained in the following description referring to the drawings. FIG. 1 shows a cross-sectional view of a photosensor in the first embodiment. In the figure, individual symbols respectively show the following parts: 1 is a body, preferably, a glass substrate; 2 is a photosensitive area, preferably, a semiconductor layer; 3 is an ohmic contact region; 4 is a control electrode; 5 is a gate electrode; 6 is a control electrode; 7 is an insulation film; 8 is a channel forming area, preferably, a semiconductor layer (a - Si:H); 9 is an ohmic contact region; 10 is a source electrode; 11 is a drain electrode; 12 is incident rays of light; 13 is a TFT; 14 is a resistor; 15 is a photo-variable resistor; 16 is a light shield; 17 is an insulation film; 18 is a passivation insulator; 20 is a body, preferably, a silicon substrate; 21 is an impurity-doped region, preferably, a source diffusion layer; 22 is an impurity-doped region, probably, a drain diffusion layer; 23 is a gate insulation film; 24 is a source electrode; 25 is a gate electrode; 26 is a drain electrode; and 27 is a back electrode.

At first, the manufacturing method will be described. Hydrogenated amorphous silicon (a - Si:H) layer 2 is deposited to be 600 nm thick on a glass substrate 1. The method of deposition is a plasma enhanced CVD method: a monosilane (SiH$_4$) based gas is introduced into a vacuum chamber and plasma is formed by applying RF power to it, and the Si and hydrogen produced in a decomposition process are deposited on the substrate.

In the above case, intrinsic amorphous silicon (a - Si) is formed, but, if phosphine (PH$_3$) is introduced, n type amorphous silicon doped with phosphorus can be formed. When diborane (B$_2$H$_6$) is introduced, p type amorphous silicon doped with boron is formed. When nitrogen and/or ammonium is introduced with SiH$_4$, a silicon nitride film (SiN film), i.e., an insulation film, is formed. When amorphous silicon is deposited, the substrate temperature is 200° C. and the speed of deposition is 1 Å/sec. It requires about 100 minutes to deposit an amorphous silicon layer that is 600 nm thick, as mentioned the above.

An ohmic contact layer 3 in the present embodiment is of n type amorphous silicon doped with phosphorus, and it is deposited following the deposition of amorphous silicon 2 which functions as a photosensitive semiconductor.

Next, a chromium (Cr) layer 150 nm thick is formed by sputter evaporation for forming a gate electrode, and after that the layer is patterned as shown in FIG. 1. After the etching of the electrode, using it as a mask, n type amorphous silicon is also etched. A remaining i layer area functions as a resistor for connecting electrodes.

Next, a SiN film 7 of 300 nm thick is deposited as an insulation film with a plasma CVD method, and following this an amorphous silicon film 8 and an n type amorphous silicon layer 9 are deposited. The thickness of the amorphous silicon film 8 is 50 nm and it constitutes a channel layer of a thin film transistor (TFT). As the film thickness is thin, it absorbs little light and so it is not influenced much by the incident light 12.

After the amorphous silicon film 8 and the n type amorphous silicon layer 9 are patterned into island shapes, Cr/Al are sputter evaporated for forming a source electrode and a drain electrode. The thickness of Cr is 100 nm, and that of Al is 300 nm. After patterning, they are etched for forming a source electrode 10 and a drain electrode 11. The n type amorphous silicon is etched off in using the source electrode and the drain electrode as masks.

The source electrode 10 is formed being in retreat from the gate electrode 5 as shown in FIG. 1, in order to introduce incident light 12 into the semiconductor layer 2. The drain electrode 11 is so formed as to cover the gap between the gate electrode 5 and the electrode 6. In other words, the incident light does not reach the semiconductor layer between the electrode 5 and the electrode 6.

Figure 2A:
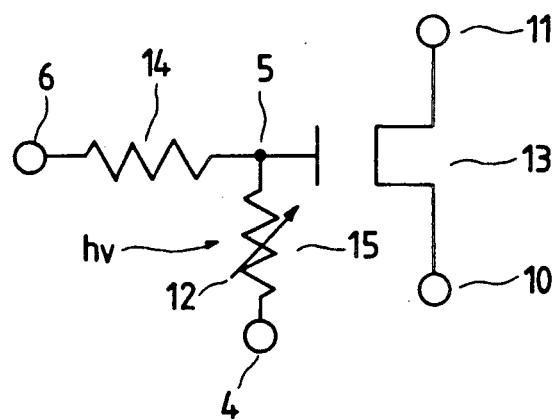
FIG. 2A is an equivalent circuit of the embodiment shown in FIG. 1.

The operation of a photosensor shown in FIG. 1 is explained in the following using an equivalent circuit shown in FIG. 2A.

The source electrode 10 of a TFT 13 is set at a reference voltage (normally ground potential), and a drain voltage of 10 V is applied to the drain electrode 11. The channel length of the TFT is 10 μm and the channel width of it is 100 μm, and so W/L is 10.

In the case of the gate electrode, a control electrode 4 is set at −10 V and a control electrode 6 is set at 30 V. A voltage to be applied to the gate of the TFT varies from 10 V to −10 V corresponding to the intensity of incident light 12. When the gate is not illuminated by the light 12, the gate 5 is given a divided voltage decided by the values of a resistor 14 and a resistor 15 when these resistors are not illuminated.

When the voltage is divided in the state where the areas which contribute to the resistors 14 and 15 of the semiconductor layer 2 are set to have the same dimensions (10 μm in length and 100 μm in width), a voltage to be applied to the gate 5 is 10 volt when there is no incident light. On the other hand, when the intensity of incident light is strong enough the resistance of a semiconductor area corresponding to the resistor 15 becomes small enough to be negligible comparing to that of the resistor 14; therefore, the voltage to be applied to the gate 5 becomes −10 volt.

As described in the above, a voltage to be applied to the gate 5 is varied from −10 V to 10 V by the existence of incident light; thereby, the drain current of the TFT 13 is also largely varied. The change of the drain current is more than 6 orders of magnitude, and in this case the ON current Id is 5μA. The drain current and the light are, so to speak, in a opposite phase. In other words, when the light is given, the drain current becomes low and when the light is not given the drain current becomes a high level.

Figure 2B:
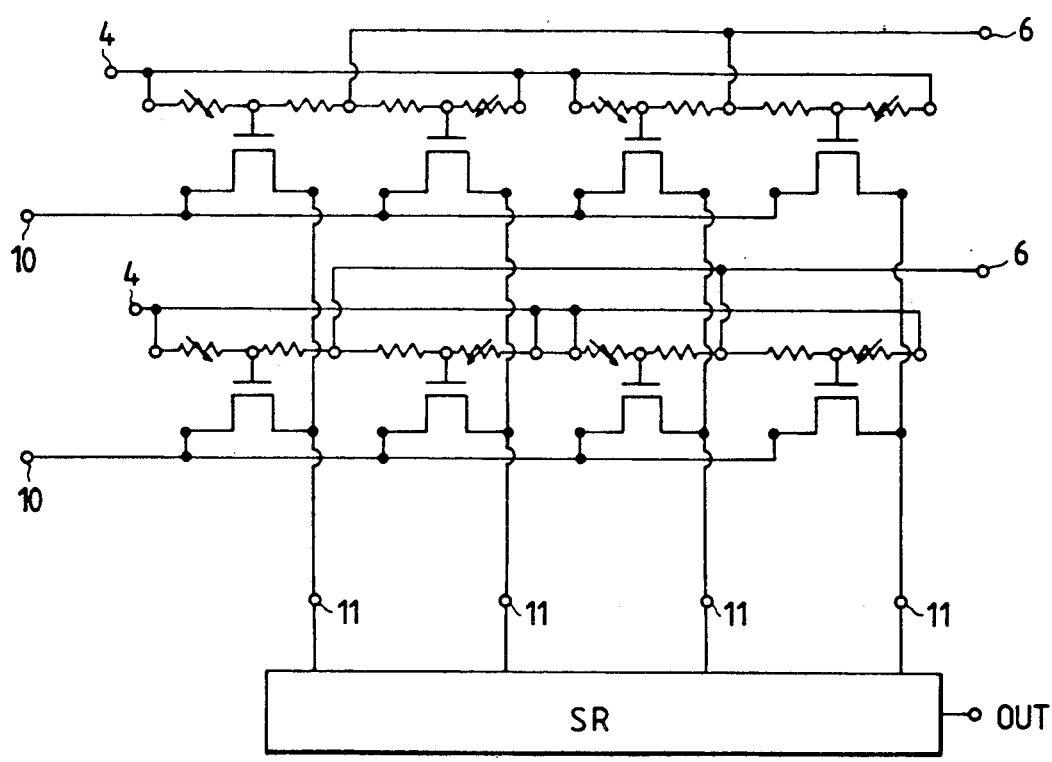
FIG. 2B is a circuit diagram in an array configuration.

The light and the drain current ca be made to be in the same phase by changing the voltages to be applied to the electrodes. In other words, if 10 V is applied to the electrode 4 and −30 V are applied to the electrode 6, 10 V are applied to the gate 5 when the light is given and −10 V is applied to the gate 5 when the light is not given. Thereby, when the light is given the drain current flows and when the light is not given the current does not flow. FIG. 2B is an equivalent circuit when the photosensors in FIG. 1 are disposed in a 4×2 arrayform. A voltage applied to a terminal 10 is varied successively and fixed voltages are applied to terminals 4 and 6, and a signal which appears at a terminal 11 is output through a shift register SR. Another method can be adopted, in which a fixed voltage is applied to the terminal 10 and the terminals 4 and 6 are driven successively by varying voltages.

Figure 3:
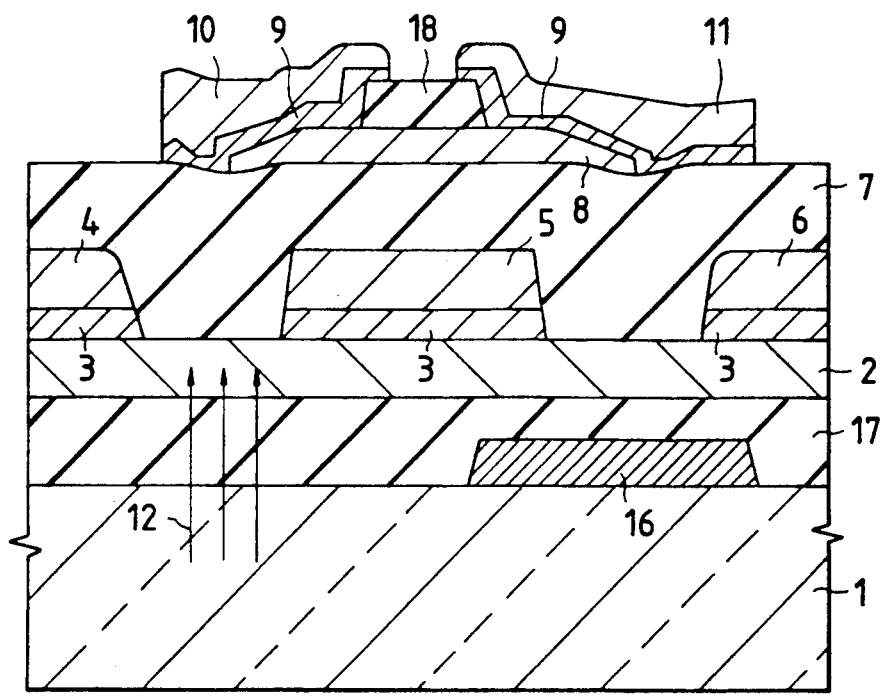
FIG. 3 is a cross-sectional view of a photosensor in a second embodiment of another TFT system according to the present invention.

FIG. 3 shows another embodiment according to the present invention.

At first, a light shield 16 of a metal like Cr is formed on a desired portion of a glass substrate, and the light shield is covered with an insulation film 17. Silicon dioxide (SiO$_2$) as a representative material of inorganic films is used for the insulation film 17, but an organic film like a transparent PIQ insulation film could also be used. In either case, similar results can be obtained. Over the insulation film, an amorphous silicon layer 2, as a semiconductor with photosensitivity, is deposited, and further a TFT is formed over it in the similar way to the embodiment shown in FIG. 1. In the embodiment shown in FIG. 3, different from the embodiment shown in FIG. 1, after a channel semiconductor film 8 is formed, a passivation insulator 18 is deposited. After the passivation insulator 18 is etched, an ohmic contact layer 9, a source electrode 10 and a drain electrode 11 are formed for the completion of a TFT.

Operation is performed in the similar way to the principle shown in FIG. 2, and excellent properties are obtained. In this embodiment, a light shield is provided, so that light can be given from the bottom of the glass substrate. In this embodiment, an example having a configuration in which resistors 14 and 15 are made from the same material, amorphous silicon, is shown, but these resistors can be made from different materials. They can be nonlinear resistors such as those of a load MOS type.

Figure 4:
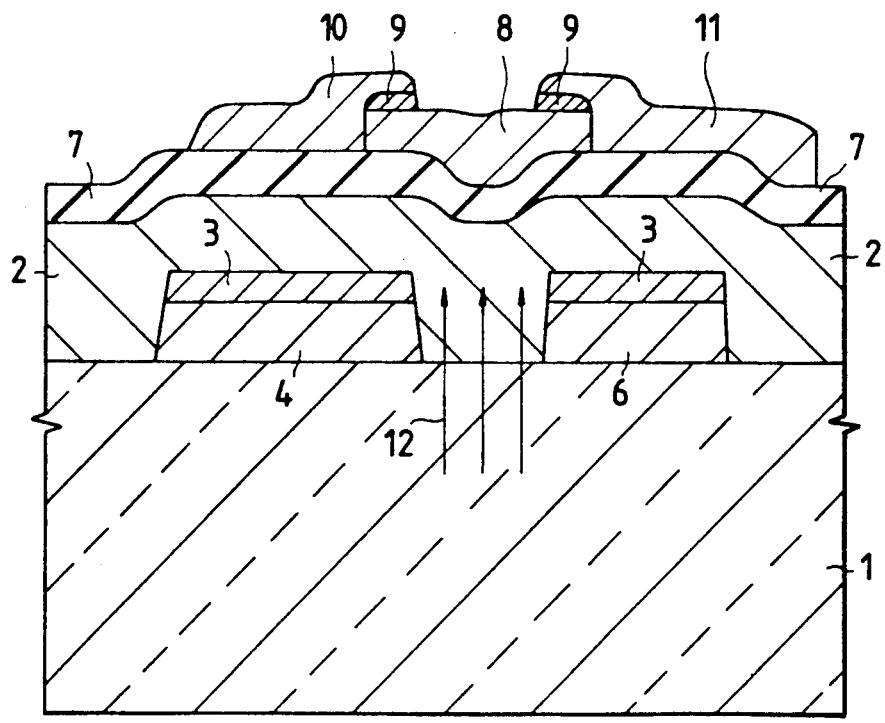
FIG. 4 is a cross-sectional view of a photosensor in a third embodiment of a further TFT system according to the present invention.

FIG. 4 shows a further embodiment according to the present invention.

A different point between the present embodiment and the embodiments mentioned above is that in the above-mentioned embodiments the gate electrode in the lower part of a TFT channel is made of a metal, whereas, in the present embodiment, it is composed of a semiconductor having photosensitivity, such as a photoconductor.

The operation of the TFT is as described in the following. When incident light 12 is not given, photocarriers are not produced in the semiconductor layer 2, and the resistance is high. Therefore, a voltage to be applied to the channel area of the TFT through a gate insulation film is low and the carriers are not induced in the channel so that the TFT goes into an OFF state.

When the intensity of incident light is strong enough, the resistance of the semiconductor layer 2 is made to be low enough by produced photocarriers, and on the interface between a semiconductor 8 and insulation film 7 enough voltage and carriers are induced to turn the transistor on. As an example of this, the source electrode 10 can be grounded, and Vd of 10 V is applied to the drain electrode 11 and Vg of 20 V can be applied to the gate electrodes 4 and 6. In such a biased condition, 20 V is applied between the source electrode and the gate, and 10 V is applied between the drain electrode and the gate. Twenty volts between the source electrode and the gate is applied to 3 layers, the amorphous semiconductor channel layer 8, the gate insulation film 7 and the semiconductor layer 2. A similar thing occurs between the gate electrodes 4 and 6. When there is no incident light, as the semiconductor layer 2 extends laterally, a voltage component applied to the semiconductor layer 2 is large and enough carriers ar not induced in the channel. But when there is enough incident light, enough carriers are produced in the semiconductor layer and holes are accumulated on the interface between the insulation film 7 and the semiconductor layer 2. In other words, the voltage between the source electrode and the gate is effectively applied to the gate insulation film, and carriers are also induced in the channel layer 8 to make a current flow, that is, the TFT goes into an ON condition.

To enhance the above-mentioned effect, it is desirable to lower the resistance of the semiconductor layer on the gate electrodes 4 and 6. For this purpose, it is preferable that the gate electrodes are composed of transparent electrodes (for example, $SnO_2$, ITO). A similar effect can be obtained by adopting the structure to be able to introduce the light to the semiconductor 2 from the upper side.

In the embodiment as shown in FIG. 4, it is a normal way of usage to make the voltages to be applied to the electrode 4 and the electrode 6 be equal. There is also a method in which the electrodes 4 and 6 are connected to the same electrode. However, by setting the voltages to be applied to the 2 electrodes independently, the range of application can be extended and also the properties of a photosensor can be improved.

Figure 5:
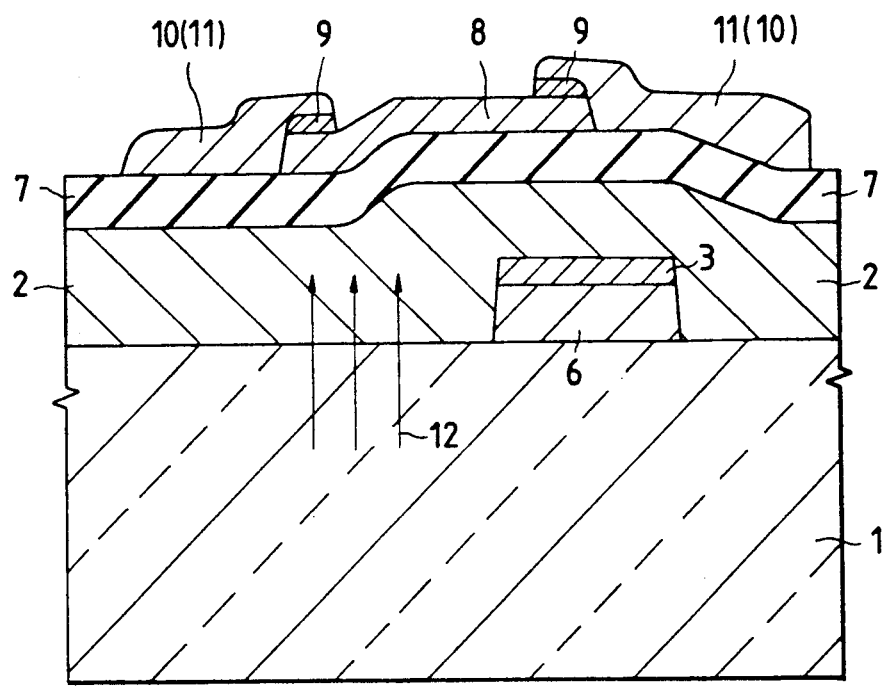
FIG. 5 is a cross-sectional view of a photosensor in a fourth embodiment of yet another TFT system according to the present invention.
Figure 6:
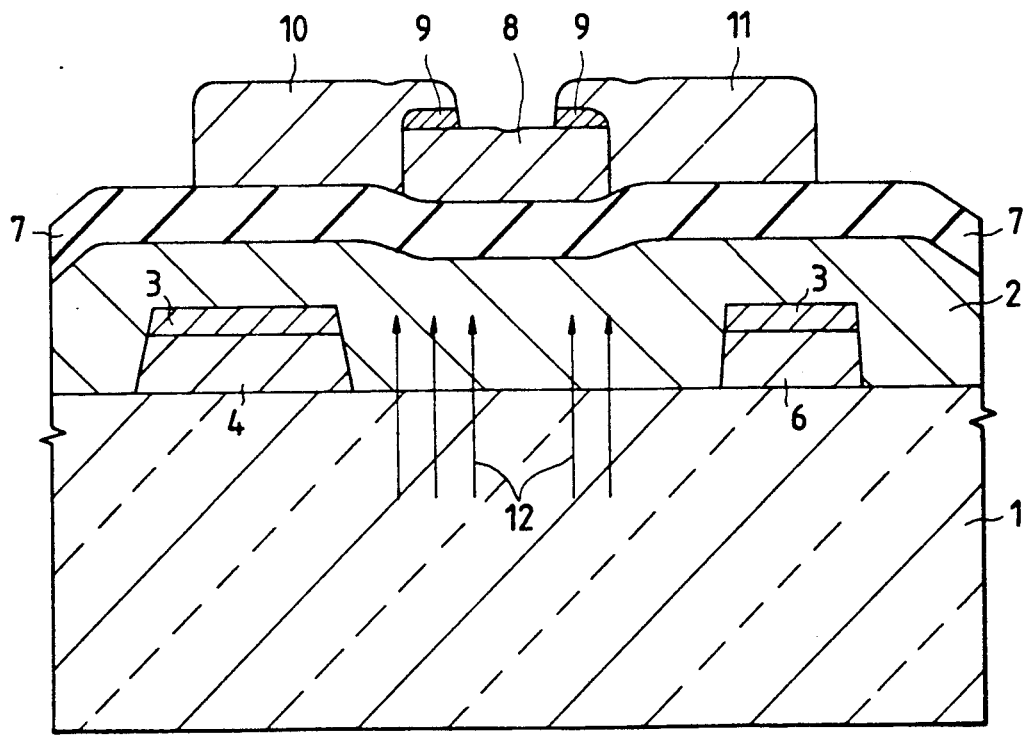
FIGS. 6 and 7 are cross-sectional view of photosensors in still further embodiments of TFT systems according to the present invention.

In FIG. 5 and FIG. 6, a similar idea to the above is shown in different embodiments.

In FIG. 5, a configuration is shown in which only one gate electrode is provided; the gate electrode 6 is provided on the source electrode side in one case, and the gate electrode 6 is provided on the drain electrode side in the other case. It is seldom that a short circuit between wirings occurs in the configuration as mentioned in the above, which facilitate the manufacturing.

In FIG. 6 a configuration is shown in which 2 gate electrodes are provided, and it has a structure to be offset with a TFT and it is effective to lower an OFF current.

Figure 7:
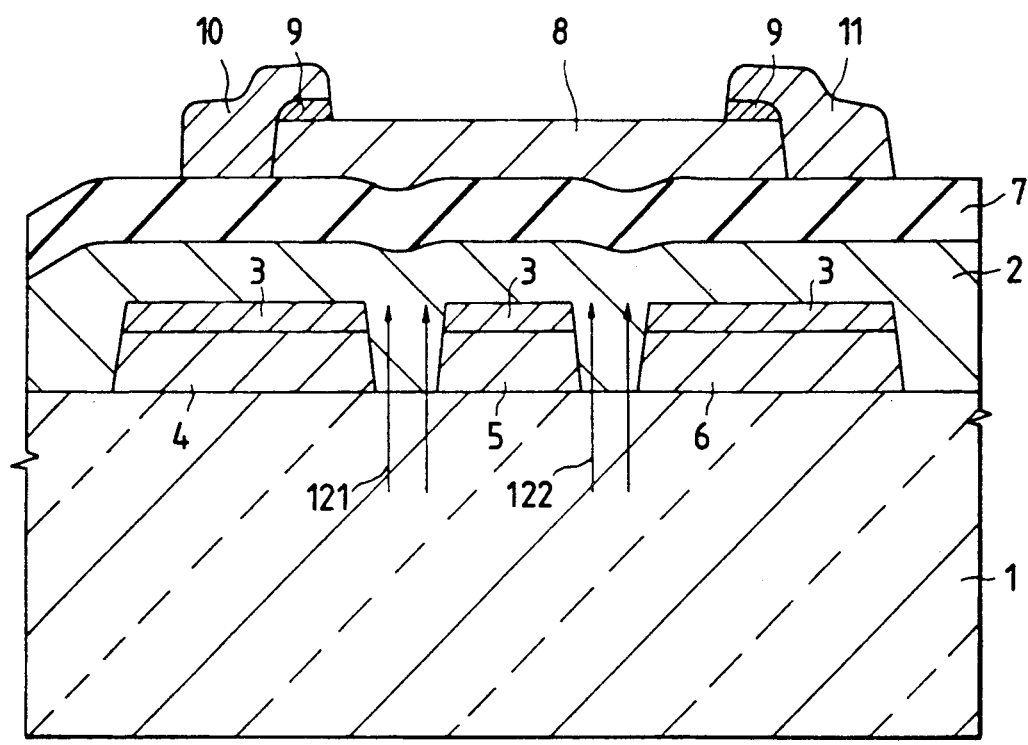

In FIG. 7 a configuration is shown in which 3 electrodes are provided, the operation range is extended by varying the voltages to be applied to these electrodes.

The range of application can be extended by adopting a configuration as mentioned in the above in which the light 121 and 122 are made to be different signals from each other and different signal voltages are applied to electrodes 4, 5 and 6, respectively.

Other variations (for example, a configuration in which the electrode 6 is eliminated from the configuration as shown in FIG. 7 or FIG. 1) can be considered. According to the purpose of usage, an optimum one will be selected.

Figure 8:
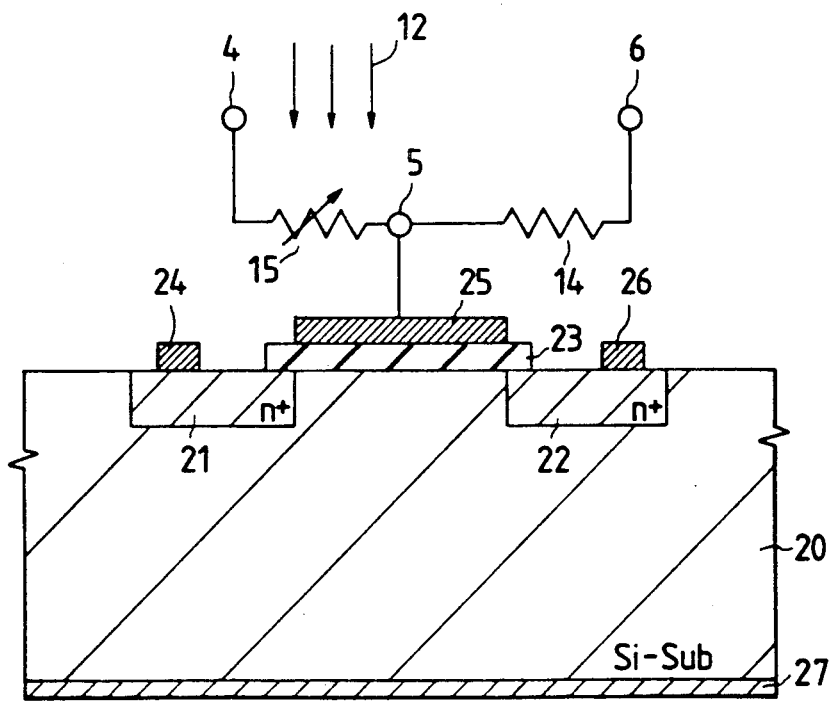
FIG. 8 and FIG. 9 are cross-sectional view of photosensors in another embodiment of a MOSFET system according to the present invention.
Figure 9:
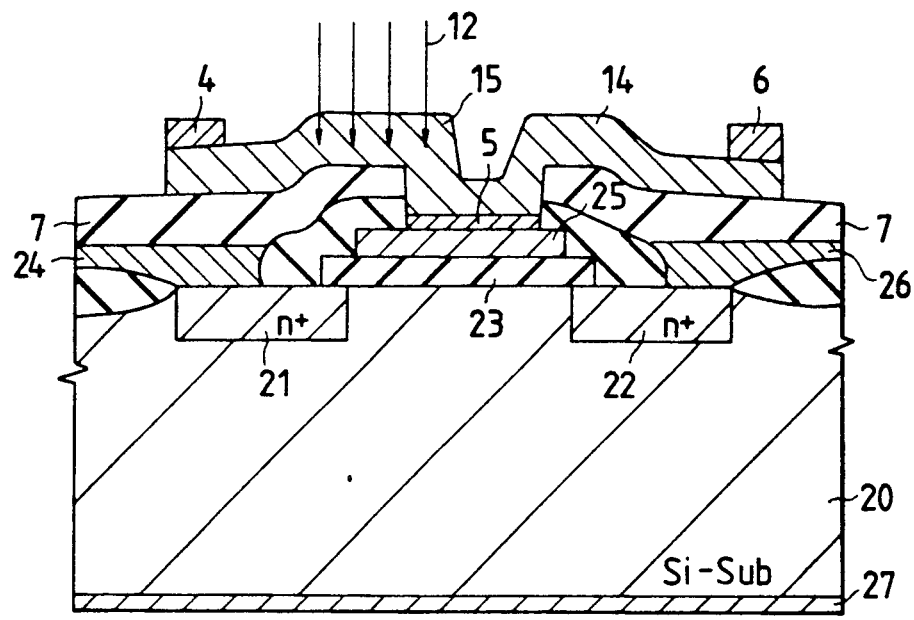

FIG. 8 shows yet another embodiment according to the present invention. The concrete configuration is shown in FIG. 9: a gate insulation film 23, a gate electrode 25, and impurity-doped regions (diffused layers or ion implanted layers) 21 and 22 (n type area) are formed on a silicon (P type Si) substrate 20. A back electrode 27 is provided on the substrate. Take-out electrodes 24 and 26 are provided on the impurity-doped regions 21 and 22. The manufacturing process is similar to that for an ordinary MOSFET, and the manufacturing process for a source electrode, a gate electrode and a drain electrode are also similar to those aforementioned. A gate electrode 25 (5) is connected to electrodes 4 and 6 through amorphous silicon photosensitive layers 14 and 15 similar to the embodiment shown in FIG. 1. The resistance of a part of the amorphous silicon photosensitive layer 14 illuminated by the incident light 12 is varied and a voltage is applied to the gate electrode 25 (5). The applied voltage is about 5 V or less.

Figure 10:
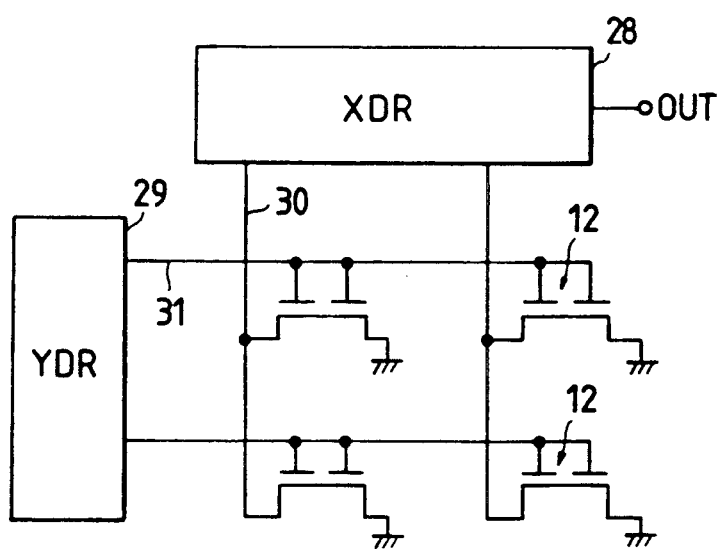
FIG. 10 is a circuit diagram of an additional embodiment.

FIG. 10 shows another embodiment according to the present invention, and the elements described in the above embodiments are disposed in a matrix shape to form an area sensor. The matrix is made to be a simplest form, 2×2, but the technique can be applied to a matrix of n×n or m×n. In FIG. 10, a signal side driving circuit 28 (XDR) drives a signal bus line 30 and a scanning side driving circuit 29 (YDR) drives a gate bus line 31. It can be applied to a 1 dimensional sensor, not only to a 2 dimensional sensor as shown in the present embodiment.

As shown in the above, the present invention is described referring to the embodiments, but the present invention is not limited to these. Besides amorphous silicon, amorphous silicon alloy (a-SiGe, a-SiC), III–V compound or II-VI compound can be used for the TFT. Besides SiMOSFET, JFET or GaAsMESFET can be used for the FET. It can be a type of an n channel, a p channel, an enhancement mode transistor or a depletion mode transistor.

A photoconductive body can be amorphous silicon, amorphous Se, a chalcogenide semiconductor, Si, a III-V compound or a II-VI compound.

An insulation film can be organic materials such as SiN, $SiO_2$, $Ta_2O_5$ or $Al_2O_3$, or their combinations.

The present invention is not limited to a single body photosensor, and it is very effective for an array sensor. It is also effective for a 1 dimensional sensor array or a 2 dimensional sensor array.

The present invention has a configuration as explained in the above; thereby it has the effectiveness as shown in the following.

A voltage corresponding to the intensity of light can be applied to a gate electrode by using a semiconductor with photosensitivity for a gate electrode, and the change in light intensity can be converted effectively to the change in a drain current. When a gate voltage is negative, even if the gate electrode is illuminated by the light, the drain current does not flow. Therefore, the ON/OFF ratio of a sensor can be made to be large. In other words, the invention has an effect in that the ratio of the drain currents in the case of ON/OFF of the voltage or of ON/OFF of the light when the voltage is ON can be made to be large. Furthermore, it has a merit that the response speed for the ON/OFF of the light is fast as it utilizes the change in resistance caused by the light.

Moreover, a photosensor with high photosensitivity is realized by the us of amorphous silicon, which makes it possible to obtain a high SN ratio even under low illuminance. Amorphous silicon is suited to manufacture a photosensor of a large area and a long one, and a photosensor can be manufactured with it by a comparatively simple process, so that it has an effect facilitating manufacture of a photosensor in an array-form.

This sensor is concerned with the structure of a gate electrode, so that it also has a merit that the connection with the MOSFET, etc., can be made comparatively easily. In most cases, a transparent electrode is not needed, so that it has an effect that the process can be simplified.

It is further understood by those in the art that the foregoing description is preferred embodiment of the disclosed device and that various changes and modifications may be made in the invention without departing from the spirit and scope thereof.

What is claimed is:

1. A semiconductor device comprising:
   a body;
   a photosensitive semiconductor layer provided on said body;
   a gate of a field effect transistor electrode provided on said photosensitive semiconductor layer;
   a pair of control electrodes coupled to said photosensitive semiconductor layer, and spaced apart from said gate electrode;
   a gate insulation film provided on said gate electrode;
   a channel area provided on said gate insulation film; and
   a source electrode and a drain electrode electrically connected to said channel area,
   wherein a voltage is applied to said gate electrode when light is incident on said photosensitive semiconductor layer.

2. A semiconductor device according to claim 1, wherein said field effect transistor is a thin film transistor.

3. A semiconductor device according to claim 1, wherein said field effect transistor is a MOSFET.

4. A semiconductor device according to claim 1, wherein said photosensitive semiconductor layer is comprised of amorphous silicon.

5. A semiconductor device according to claim 1, wherein said field effect transistor is a thin film transistor using amorphous silicon.

6. A semiconductor device according to claim 1, wherein said body is a glass substrate.

7. A semiconductor device according to claim 1, wherein said body is a silicon substrate.

8. A semiconductor device comprising:
   a body; and
   a field effect transistor provided on the body, wherein said field effect transistor comprises:
   a first electrode;
   a second electrode; and
   a gate means for controlling a channel formed between the first and second electrode, wherein said gate means comprises:
      a gate electrode to be applied with a voltage for controlling current flow between the first and second electrodes through the channel;
      a first control electrode to be applied with a first voltage;
      a second control electrode to be applied with a second voltage;
      a semiconductor layer provided between the gate electrode and the first control electrode; and
      a resistor provided between the gate electrode and the second control electrode,
      wherein the channel is provided over the semiconductor layer and the gate electrode, and
      wherein a resistance of the semiconductor layer is changed when light is incident on the semiconductor layer so as to change the voltage applied to the gate electrode.

9. A semiconductor device comprising:
   a body; and
   a field effect transistor provided on the body, wherein said field effect transistor comprises:
   a first electrode;
   a second electrode; and
   a gate means for controlling a channel formed between the first and second electrode, and further wherein said gate means comprises:
      a gate electrode to be applied with a voltage for controlling current flow between the first and second electrodes through the channel; and
      a semiconductor layer having a resistance higher than a resistance of the gate electrode when a light is not incident on the semiconductor layer, the semiconductor layer being located between the channel and the gate electrode,
      wherein a resistance of the semiconductor layer is reduced when light is incident on the semiconductor layer so as to apply the gate voltage to the channel.

10. A semiconductor device according to claim 1, wherein said pair of control electrodes are provided on said photosensitive semiconductor layer.

11. A semiconductor device according to claim 10, wherein said pair of control electrodes are provided on opposite sides of said gate electrode.

12. A semiconductor device according to claim 8, wherein an insulating film is provided between the channel of the gate electrode and the semiconductor layer, and wherein said field effect transistor is a thin film transistor formed on said insulating film.

13. A semiconductor device according to claim 12, wherein said insulating film is transparent t light so that light can pass through a redetermined portion of said insulating film to be incident upon a portion of the semiconductor layer located below said predetermined portion of said insulating film.

14. A semiconductor device according to claim 13, wherein said semiconductor layer extends under said first control electrode, said second control electrode and said gate electrode, and wherein said resistor is comprised of a portion of said semiconductor layer that does not receive light.

15. A semiconductor device according to claim 14, wherein said resistor is located in a portion of said semiconductor layer that is blocked from receiving light by said thin film transistor formed on a portion of said insulating film located above said portion of said semiconductor layer where said resistor is formed.

16. A semiconductor device according to claim 12, wherein said gate electrode and said first and second control electrodes are formed on said semiconductor layer, wherein said semiconductor layer is formed over a transparent base, and wherein a first portion of said semiconductor layer between said gate electrode and said first control electrode is arranged to receive light through said transparent base to change the resistance of said first portion of the semiconductor layer.

17. A semiconductor device according to claim 16, further comprising a light shield formed between said transparent base and a second portion of the semiconductor layer which is between the gate electrode and said second control electrode to prevent said second portion of the semiconductor layer from receiving light, wherein said second portion of said semiconductor layer forms said resistor.

18. A semiconductor device according to claim 9, wherein a pair of said gate electrodes are provided, said pair of gate electrodes and said semiconductor layer being formed on a base with said pair of gate electrodes being spaced apart from one another and with a predetermined portion of said semiconductor layer interposed between said pair of gate electrodes.

19. A semiconductor device according to claim 18, wherein said base is transparent to light.

20. A semiconductor device according to claim 8 wherein said field effect transistor is a thin film transistor.

21. A semiconductor device according to claim 8 wherein said field effect transistor is a MOSFET.

22. A semiconductor device according to claim 8 wherein said semiconductor layer having photosensitivity is of amorphous silicon.

23. A semiconductor device according to claim 8 wherein said field effect transistor is a thin film transistor using amorphous silicon.

24. A semiconductor device according to claim 8 wherein said body is a glass substrate.

25. A semiconductor device according to claim 8 wherein said body is a silicon substrate.

26. A semiconductor device according to claim 9 wherein said field effect transistor is a thin film transistor.

27. A semiconductor device according to claim 9 wherein said field effect transistor is a MOSFET.

28. A semiconductor device according to claim 9 said semiconductor layer comprised of amorphous silicon.

29. A semiconductor device according to claim 9 wherein said field effect transistor is a thin film transistor using amorphous silicon.

30. A semiconductor device according to claim 9 wherein said body is a glass substrate.

31. A semiconductor device according to claim 9 wherein said body is a silicon substrate.

* * * * *